United States Patent
Chen et al.

(10) Patent No.: US 9,190,377 B2
(45) Date of Patent: Nov. 17, 2015

(54) METAL COATING FOR INDIUM BUMP BONDING

(75) Inventors: Sihai Chen, NewHartford, NY (US); Ning-Cheng Lee, New Hartford, NY (US)

(73) Assignee: Indium Corporation, Clinton, NY (US)

( * ) Notice: Subject to any disclaimer, the term of this patent is extended or adjusted under 35 U.S.C. 154(b) by 315 days.

(21) Appl. No.: 13/168,505

(22) Filed: Jun. 24, 2011

(65) Prior Publication Data

US 2011/0315429 A1   Dec. 29, 2011

Related U.S. Application Data

(60) Provisional application No. 61/358,229, filed on Jun. 24, 2010.

(51) Int. Cl.
*H01B 1/08*      (2006.01)
*H01L 23/00*    (2006.01)
*H01L 27/146*   (2006.01)

(52) U.S. Cl.
CPC ............ *H01L 24/16* (2013.01); *H01L 24/11* (2013.01); *H01L 24/13* (2013.01); *H01L 24/81* (2013.01); *H01L 27/14618* (2013.01); *H01L 27/14634* (2013.01); *H01L 27/14636* (2013.01); *H01L 2224/136* (2013.01); *H01L 2224/1357* (2013.01); *H01L 2224/1358* (2013.01); *H01L 2224/13109* (2013.01); *H01L 2224/13582* (2013.01);
(Continued)

(58) Field of Classification Search
USPC ............. 174/126.1, 126.2; 438/107, 108
See application file for complete search history.

(56) References Cited

U.S. PATENT DOCUMENTS 5,192,835 A * 3/1993 Bull et al. .............. 174/260
5,893,725 A * 4/1999 Bhansali ................ 438/108
(Continued)

FOREIGN PATENT DOCUMENTS

WO          8902653 A1    3/1989
WO    WO 2009/031522   *  3/2009

OTHER PUBLICATIONS

International Search Report and the Written Opinion for International App No. PCT/US2011/041838, Mailed Jan. 24, 2012, Authorized Officer: Pitard, Jacqueline.
(Continued)

*Primary Examiner* — Chau N Nguyen
(74) *Attorney, Agent, or Firm* — Sheppard Mullin Richter & Hampton LLP

(57) ABSTRACT

A process of making efficient metal bump bonding with relative low temperature, preferably lower than the melting point of Indium, is described. To obtaining a lower processing temperature (preferred embodiments have a melting point of <100° C.), a metal or alloy layer is deposited on the indium bump surface. Preferably, the material is chosen such that the metal or alloy forms a passivation layer that is more resistant to oxidation than the underlying indium material. The passivation material is also preferably chosen to form a low melting temperature alloy with indium at the indium bump surface. This is typically accomplished by diffusion of the passivation material into the indium to form a diffusion layer alloy. Various metals, including Ga, Bi, Sn, Pb and Cd, that can be used to form a binary to quaternary low melting point alloy with indium. In addition, diffusion of metal such as Sn, Sn—Zn into Ga—In alloy; Sn, Cd, Pb—Sn into Bi—In alloy; Cd, Zn, Pb, Pb—Cd into Sn—In alloy can help adjust the melting point of the alloy.

18 Claims, 2 Drawing Sheets

(52) U.S. Cl.
CPC ............... *H01L2224/13583* (2013.01); *H01L 2224/13599* (2013.01); *H01L 2224/13605* (2013.01); *H01L 2224/13609* (2013.01); *H01L 2224/13611* (2013.01); *H01L 2224/13613* (2013.01); *H01L 2224/13616* (2013.01); *H01L 2224/13618* (2013.01); *H01L 2224/81193* (2013.01); *H01L 2224/81201* (2013.01); *H01L 2224/81801* (2013.01); *H01L 2924/00013* (2013.01); *H01L 2924/0103* (2013.01); *H01L 2924/014* (2013.01); *H01L 2924/01006* (2013.01); *H01L 2924/01033* (2013.01); *H01L 2924/01047* (2013.01); *H01L 2924/01049* (2013.01); *H01L 2924/01075* (2013.01); *H01L 2924/01078* (2013.01); *H01L 2924/01082* (2013.01); *H01L 2924/01322* (2013.01); *H01L 2924/15788* (2013.01)

(56) References Cited

U.S. PATENT DOCUMENTS

| | | | | |
|---|---|---|---|---|
| 6,610,591 | B1* | 8/2003 | Jiang et al. | 438/613 |
| 6,787,442 | B2* | 9/2004 | Hayashida | 438/612 |
| 7,534,715 | B2* | 5/2009 | Jadhav et al. | 438/612 |
| 7,719,853 | B2* | 5/2010 | Shih | 361/767 |
| 7,977,158 | B2* | 7/2011 | Kurita | 438/107 |
| 2008/0277784 | A1* | 11/2008 | Ozaki et al. | 257/737 |
| 2010/0252926 | A1* | 10/2010 | Kato et al. | 257/738 |
| 2011/0147066 | A1* | 6/2011 | Sidhu et al. | 174/261 |

OTHER PUBLICATIONS

Cao S et al, Transparency conversion mechanism and laser induced fast response of bimetallic Bi/In thin film, Micro-and Nanotechnology: Materials, Processes, Packaging, and Systems IV. Proceedings of SPIE. Bellingham, WA. USA. vol. 7269. 2008. pp. 726910-1-726910-9. 2008.

Tu Y et al: Wavelength-Invariant Resist Composed of Bimetallic Layers, Materials Research Society Symposium Proceedings. vol. 745. 2003. pp. N3.8.1-N3.8.6. 2003.

Savvin V S et al: Phase Formation in Contact of Dissimilar Metals, Journal of Physics: Conference Series. Institute of Physics Publishing. Bristol. GB. vol. 98. No. 5. 2008. pp. 52002-1-52002-11.

M. Lozano, E, Cabruja, A. Collado, J. Santander, M. Ullan, Bump bonding of pixel systems, Nuclear Instruments and Methods in Physics Research. A, 473 (2001) 95-101.

P. Merken. J. John, et al., Technology for very dense hybrid detector arrays using electroplated indium solder bumps, IEEE Transactions on Advanced Packaging. vol. 26, No. 1, Feb. 2003.

J. Jiang, S. Tsao. et al., Fabrication of indium bumps for hybrid infrared focal plane array applications, Infrared Physics & Technology, 45 (2004) 143-151.

Y.T. Tian, C. Q. Liu, D. Hutt, et al., Electrodeposition of indium for bump bonding, 58th Electronic Components & Technology Conference, Proceedings (2008) 2096-2100.

S. Cihangir, S. Kwan, Characterization of indium and solder bump bonding for pixel detectors, Nuclear Instruments and Methods in Physics Research A, 476 (2002) 670-675.

J. Jiang, K. Mi, S. Tsao, W. Zhang, H. Lim, T. O'Sullivan, T. Sills, and M. Razeghi, G. J. Brown, M. Z. Tidrow, Demonstration of a 256x256 middle-wavelength infrared focal plane array based on InGaAs/InGaP quantum dot infrared photodectectors, Applied Physics Letters, vol. 84, No. 13, Mar. 29, 2004.

* cited by examiner

METAL COATING FOR INDIUM BUMP BONDING

CROSS-REFERENCE TO RELATED APPLICATIONS

This application claims the benefit of U.S. Provisional Application No. 61/358,229, entitled Metal Coating for Improving Indium Bump Bonding, Filed on Jun. 24, 2010, which is herein incorporated by reference in its entirety.

TECHNICAL FIELD

The presently disclosed systems and methods relate generally to lead-free solders, and more particularly, some embodiments relate to systems, methods and technologies for allowing metal bump bonding with relatively low temperatures using a metal or alloy layer on the indium bump surface.

DESCRIPTION OF THE RELATED ART

Flip chip hybridization, sometimes known as bump bonding, is a process for microelectronics packaging and assembly that electrically and physically connects a chip to a substrate without the need for peripheral wirebonding. Conductive connections are provided using interconnect bumps made of a solder or indium material. This provides a low-profile connection with relatively low lead resistance and yields reliable interconnects.

Bump bonding is used, for example, to combine focal plane arrays with a readout integrated circuit to form an infrared sensor. The applications of this technique are numerous and include, for example, missile or related weapons guidance sensors, infrared astronomy manufacturing inspection, thermal imaging for firefighting, medical imaging and infrared phenomenology. It is especially suitable for spaceflight applications as it significantly reduced the size of the sensor devices.

Indium has been widely used as material of choice in bump bonding processes due to its relatively low melting point of 157° C. and its compliance against stresses caused by coefficient of thermal expansion (CTE) mismatches between the chip and substrate, even at cryogenic temperatures. There are several techniques used for indium bump formation, including for example evaporation resist masking, electroless plating, printed bump formation, and electrodeposition. Indium bump bonding is capable of high-yield fabrication at 20 micrometer pitch with small bump sizes by using an evaporation mask process.

Generally, flip chip bump bonding processes include following steps: rerouting and under bump metallization (UBM), bumping, flip chip alignment and placing, reflow, anneal or adhesive bonding, and underfilling. Because the indium bumps are directly connected with semiconductor materials such as HgCdTe, which is very fragile upon thermal shock and mechanical stress, steps like reflow and underfilling (needing a curing process at a temperature between 140 to 180° C.) are normally not desirable, and a cold welding process at a lower heating temperature and a lower press pressure is preferred.

However, oxidation of the indium bumps has been a hindrance to cold welding and lower press pressures. The indium oxide layer has been shown to deteriorate the fluxless solderability of indium bump under melting conditions and has a negative impact on cold welding. Because the bonding process may take several hours to complete, the formation of indium oxide is inevitable in most processes. Even when the indium surface is pre-cleaned using a solution such as HCl, if the fresh surface is exposed in air, a robust oxide shell forms quickly and hinders the bonding.

Accordingly, removing the indium oxide layer before bonding becomes imperative. More critically, as the bump size decreases, breaking through the oxide layer becomes even more difficult or impossible because the thickness of indium oxide layer remains constant. One method to solve this problem is to replace the thin indium oxide layer on a pure indium surface with a passivation coating to prevent the indium from re-oxidation in air for at least several hours. Also, this passivation layer should not hamper the bonding strength thereby improving the reliability of semiconductor devices.

Coating the indium surface with a thin layer of inert metal such as silver has been reported as a way to prevent indium oxide formation. Experiments have been carried out during a fluxless flip-chip bonding study for vertical-cavity surface-emitting laser arrays on a glass substrate. It was found that the silver coating could protect the inner indium bump from oxidation and decrease the melting temperature of the indium solders by less than 13° C. As a result, the adhesive strength between indium bump and the chip pad could be enhanced. In this approach, the die shear strength of the silver-coated indium bonding at the optimized bonding temperature of 150° C. was observed to enhance 40% compared to that without silver coating. However, little enhancement effect was seen at 100° C. The 150° C. processing temperature of the above silver coating method is still high considering the fragile nature of the photosensitive components and readout circuits.

BRIEF SUMMARY

According to various embodiments of the disclosed systems and methods, a method of joining a device and a substrate each having a plurality of solder bumps, includes: providing respective indium solder bumps on the device and the substrate, the indium solder bumps comprising a diffusion layer at or near the surface thereof created by diffusion of a metal passivation layer into the indium solder bumps; causing the indium solder bumps on the device to come into contact with corresponding indium solder bumps on the substrate; increasing a temperature of the device and substrate and their indium solder bumps to a first temperature, wherein the first temperature is a temperature at which the diffusion layer melts.

In various embodiments, sufficient pressure is applied to the device and substrate to push away the melted diffusion layer allowing the indium in the respective indium solder bumps to bond together. In some embodiments, the method further includes, after the diffusion layer in the indium solder bumps melts, decreasing the temperature of the assembly to allow the melted diffusion layer to fuse together.

In some embodiments, the passivation layer comprises at least one of gallium (Ga), bismuth (Bi), lead (Pb), cadmium (Cd) and tin (Sn). In other embodiments, the passivation layer comprises first and second layers, each of the first and second layer comprising at least one of gallium, bismuth, lead, cadmium and tin. The diffusion layer may comprise bismuth present in indium in amounts from approximately 11% to 74%, or from approximately 31% to 39%.

The method in various embodiments can further include the step of depositing a first metal layer to an indium bump to form the indium solder bump with the diffusion layer. Also, the method can include the step, after the first metal deposition step, of depositing a second metal coating. In some embodiments, the first metal layer deposited can include gallium and the second metal layer deposited comprises tin, while, in other embodiments the first metal layer deposited comprises bismuth and the second metal layer deposited comprises material selected from tin, lead or cadmium; while, in still other embodiments the first metal layer deposited comprises tin and the second metal layer deposited comprises material selected from zinc, lead or cadmium.

In further embodiments, the method can further include the step, after depositing the second metal layer, of depositing a third metal layer. In some embodiments, the first and second layers comprise gallium and tin, and the third layer comprises zinc, while in other embodiments the first and second layers comprise bismuth and lead, and the third layer comprises tin, while in still other embodiments the first and second layers comprise tin and lead, and the third layer comprises cadmium.

In yet another embodiment, an indium solder bump includes a diffusion layer at or near the surface thereof created by diffusion of a metal passivation layer into the indium solder bumps. In some embodiments, the passivation layer can include at least one of Gallium, Bismuth, Lead, Cadmium and Tin. The passivation layer can include in various embodiments, first and second layers, each of the first and second layer comprising at least one of Gallium, Bismuth, Lead, Cadmium and Tin.

Other features and aspects of the disclosed systems and methods will become apparent from the following detailed description, taken in conjunction with the accompanying drawings, which illustrate, by way of example, the features in accordance with embodiments of the disclosed systems and methods. The summary is not intended to limit the scope of the claimed invention, which is defined solely by the claims attached hereto.

BRIEF DESCRIPTION OF THE DRAWINGS

The present invention, in accordance with one or more various embodiments, is described in detail with reference to the included figures. The drawings are provided for purposes of illustration only and merely depict typical or example embodiments of the invention. These drawings are provided to facilitate the reader's understanding of the invention and shall not be considered limiting of the breadth, scope, or applicability of the invention. The figures are not intended to be exhaustive or to limit the invention to the precise form disclosed. It should be understood that the invention can be practiced with modification and alteration, and that the invention on be limited only by the claims and the equivalents thereof.

Figure 1:
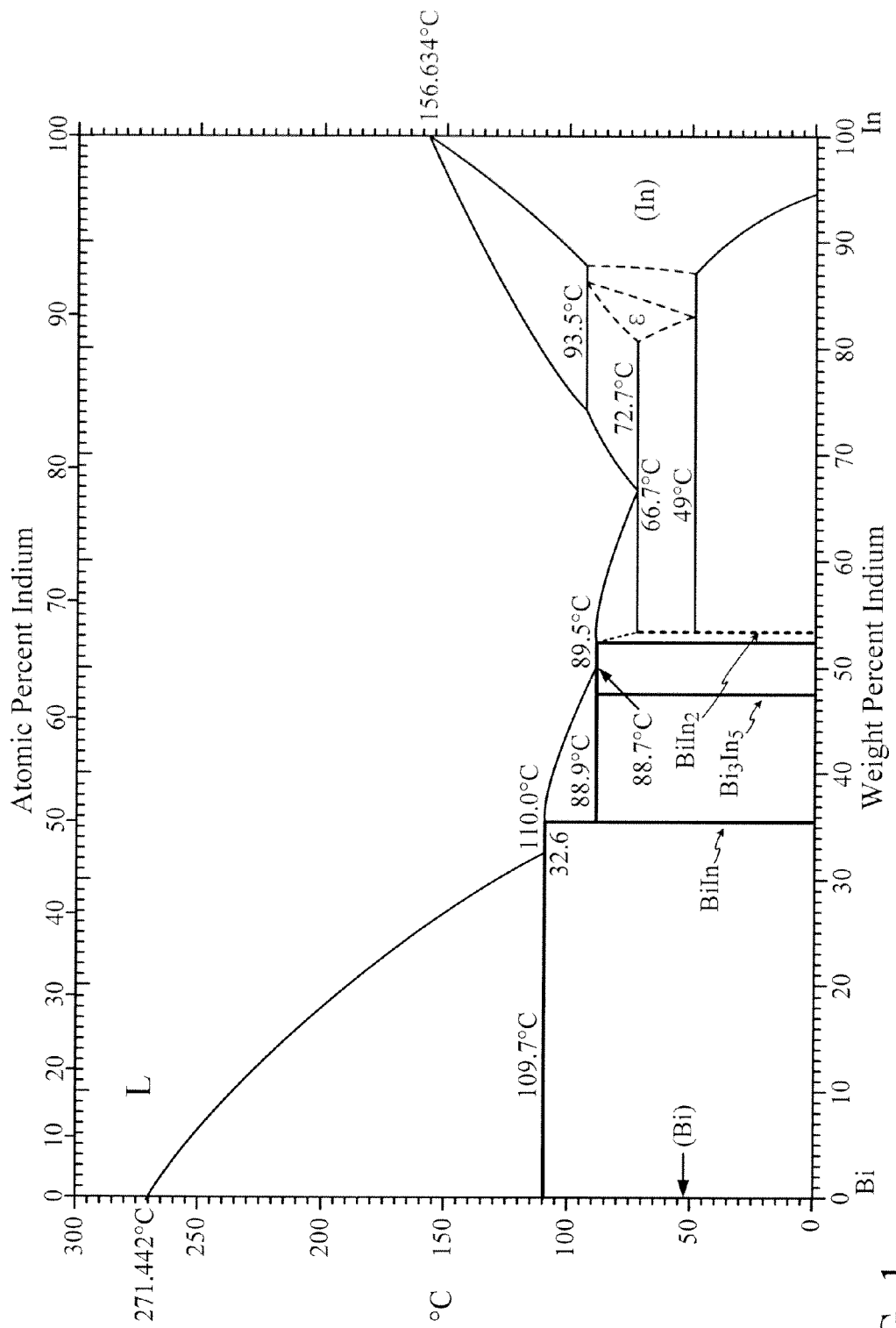
FIG. 1 is a phase diagram of indium-bismuth.

The Figures are not intended to be exhaustive or to limit the claimed invention to the precise form disclosed. It should be understood that the disclosed systems and methods can be practiced with modification and alteration, and that the claimed invention should be limited only by the claims and the equivalents thereof.

DETAILED DESCRIPTION OF THE
EMBODIMENTS OF THE INVENTION

The present invention is directed toward compositions and structures, and toward methods for providing compositions and structures for metal bump bonding with relatively low temperatures, preferably lower than the melting temperature of indium. To obtain a lower processing temperature (preferred embodiments have a melting point of <100° C.), a metal coating method is provided using, in some embodiments, compositions of metals that have a eutectic reaction with indium with a relatively low eutectic temperature. For example, some compositions have a eutectic reaction with indium with a eutectic temperature lower than 150° C.

According to various embodiments, a metal or alloy layer is deposited on the indium bump surface. Preferably, the material is chosen such that the metal or alloy forms a passivation layer that is more resistant to oxidation than the underlying indium material. The passivation material is also preferably chosen to form a low melting temperature alloy with indium at the indium bump surface. This is typically accomplished by diffusion of the passivation material into the indium to form a diffusion layer alloy. One or more layers of metal can be deposited on an indium bump surface and the formation of binary, ternary and even quaternary alloys can be used to lower the melting points. Table 1 shows various metals, including Ga, Bi, Sn, Pb and Cd, that can be used to form a binary to quaternary low melting point alloy with indium. In addition, diffusion of different metals such as Sn, Sn—Zn into Ga—In alloy; Sn, Cd, Pb and Sn into Bi—In alloy; Cd, Zn, Pb and Cd into Sn—In alloy can help adjust the melting point of the alloy. Before cold-welding, the metal or alloy layer can protect the indium bump from oxidation. During the cold-welding (with a processing temperature normally <150° C.), this alloy melts and is pushed away to facilitate the indium bump bonding. As one example, bismuth can lower the melting temperature (both solidus and liquidus) of indium significantly. Bismuth also provides a passivation layer over the indium bump that is resistant to oxidation. Examples herein are described in terms of one embodiment in which bismuth is applied over indium solder bumps to provide a passivation layer and to form a diffusion layer of an indium-bismuth alloy. After reading this description, one of ordinary skill in the art will understand how the process can be used and structures created with other materials.

TABLE 1

LIQUIDUS, SOLIDUS AND CORRESPONDING COMPOSITION
OF SELECTED ALLOYS CONTAINING INDIUM

| Indalloy # | Liquidus | Solidus | Composition | | | |
|---|---|---|---|---|---|---|
| 46L | 8 | 7 | 61.0 Ga | 25.0 In | 13.0 Sn | 1.0 Zn |
| 51E | 11 E | 11 | 66.5 Ga | 20.5 In | 13.0 Sn | |
| 60 | 16 E | 16 | 75.5 Ga | 24.5 In | | |
| 51 | 17 | 11 | 62.5 Ga | 21.5 In | 16.0 Sn | |
| 77 | 25 | 16 | 95.0 Ga | 5.0 In | | |
| 136 | 58 E | 58 | 49.0 Bi | 21.0 In | 18.0 Pb | 12.0 Sn |
| 19 | 60 E | 60 | 51.0 In | 32.5 Bi | 16.5 Sn | |
| 18 | 62 E | 62 | 61.7 In | 30.8 Bi | 7.5 Cd | |
| 162 | 72 E | 72 | 66.3 In | 33.7 Bi | | |
| 25 | 78 E | 78 | 48.5 Bi | 41.5 In | 10.0 Cd | |
| 174 | 79 E | 79 | 57.0 Bi | 26.0 In | 17.0 Sn | |
| 27 | 81 E | 81 | 54.0 Bi | 29.7 In | 16.3 Sn | |
| 8 | 93 E | 93 | 44.0 In | 42.0 Sn | 14.0 Cd | |
| 224 | 108 E | 108 | 52.2 In | 46.0 Sn | 1.8 Zn | |
| 53 | 109 E | 109 | 67.0 Bi | 33.0 In | | |
| 1E | 118 E | 118 | 52.0 In | 48.0 Sn | | |
| 253 | 123 E | 123 | 74.0 In | 26.0 Cd | | |
| 1 | 125 | 118 | 50.0 In | 50.0 Sn | | |
| 13 | 125 MP | | 70.0 In | 15.0 Sn | 9.6 Pb | 5.4 Cd |
| 70 | 130 | 121 | 40.0 In | 40.0 Sn | 20.0 Pb | |
| 71 | 131 | 118 | 52.0 Sn | 48.0 In | | |
| 290 | 143 E | 143 | 97.0 In | 3.0 Ag | | |
| 87 | 145 | 118 | 58.0 Sn | 42.0 In | | |

(E = EUTECTIC, MP = MELTING POINT).

FIG. 1 is an indium-bismuth phase diagram. As indicated in the phase diagram in FIG. 1, when the amounts of bismuth in indium increase from 0 to 34%, the solidus and liquidus temperatures of the alloy both decrease. The liquidus temperature can reach as low as 66.7° C., which is about 90° C. lower than that of the melting point of indium. At a process temperature of 100° C., the alloy will exist in pure liquid state or as a liquid-solid mixture as long as the bismuth content in the alloy ranges from 11% to 65%. If the content of the bismuth in the alloy can be further controlled within 31% to 39%, the process temperature can even decrease to 80° C., in order to keep the alloy in the liquid state. Accordingly, the application of a thin layer of bismuth over an indium solder bump can be performed to achieve an alloy having a lower melting point than the original indium solder bump. The thickness of the bismuth layer can be chosen such that after diffusion a sufficient concentration of bismuth is present in the diffusion layer to achieve desired melting temperatures. The thickness of the bismuth layer can be from several nanometers to several hundreds of micrometers. Preferably, in one embodiment the bismuth layer applied is from 1 to 2 mils thick, or about 25 to 50 microns, although other thicknesses can be used.

Figure 2:
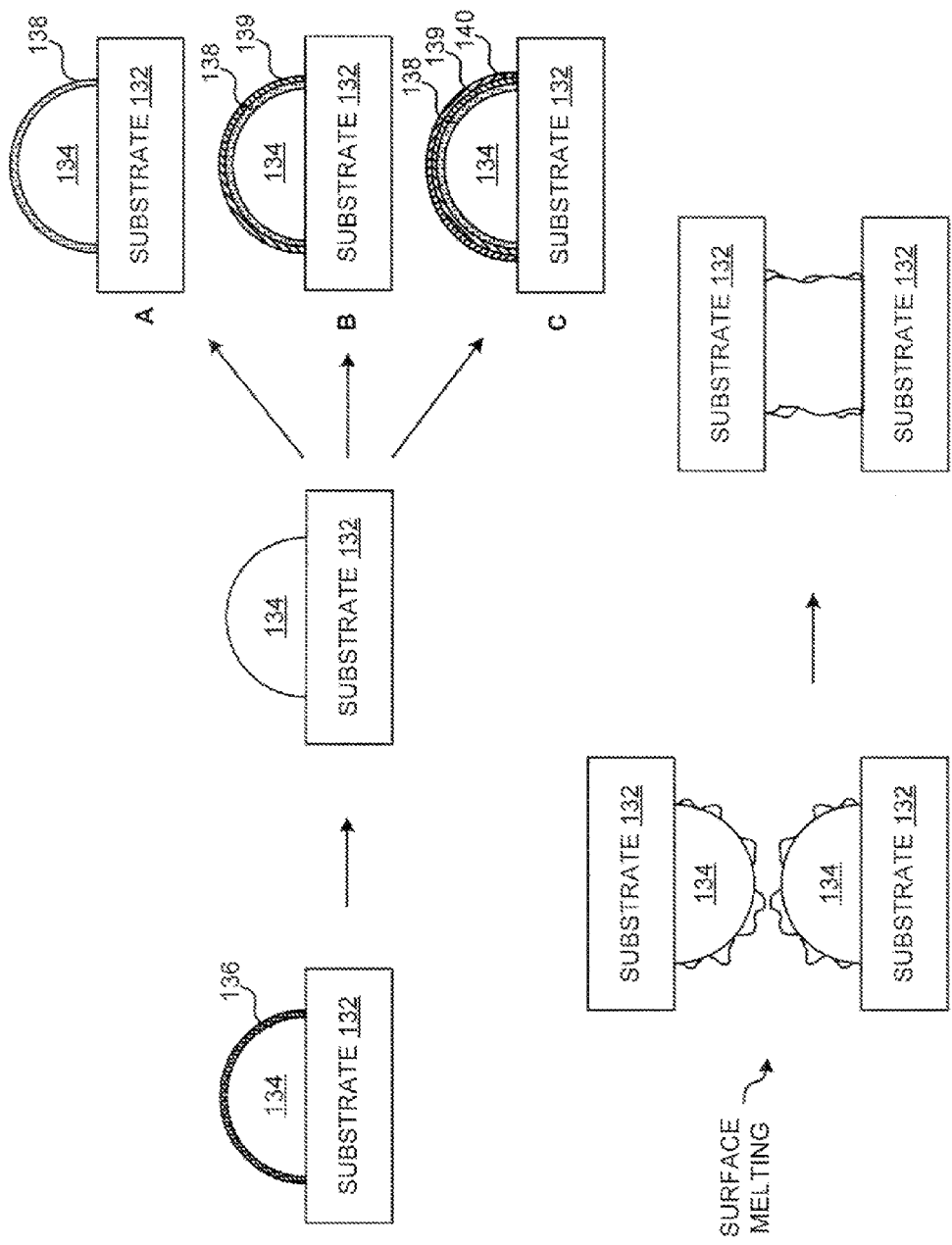
FIG. 2 is a diagram illustrating an example bonding process in accordance with embodiments of the invention.

FIG. 2 is a diagram illustrating an example process for bismuth coating in accordance with one embodiment of the invention. First an indium bump 134 is formed on the substrate 132, which can be done using known techniques. However, absent a passivation layer, an oxidation layer 136 will form in a relatively short period of time. Accordingly, as shown in cross-section depiction A of the indium bump, just before coating, the oxide layer 136 is removed and a coating 138 is applied. As described above, the coating 138 can he chosen from among a plurality of metals and alloys but in one embodiment the coating 138 is a thin layer of bismuth. Preferably, in one embodiment the bismuth layer 138 is from 1 to 2 mils thick, or about 25 to 50 microns.

This layer coating the indium 134 serves two purposes. First, the coating 118 protects the indium surface from oxidation because bismuth is more stable than indium against oxidation based on the oxide formation free energy data. Second, a low melting phase alloy is created at the interface between the bismuth 138 and indium 134 due to atomic inter-diffusion. In other words, a diffusion layer is formed. As described above, the amount of bismuth can be selected such that this diffusion layer alloy has a lower melting temperature than the underlying indium. Additional layers of different kinds of metals such as those listed in Table 1 can also he added to further adjust the melting pubis. For example, referring to FIG. 2, the passivation layer shown in cross-section depiction B has two metal diffusion lavers 138 and 139, and the passivation layer in cross-section depiction C has three metal diffusion layers 138, 139, and 140.

To join the components they are placed in relation to one another such that their respective solder bumps 134 are aligned and touching. The temperature is increased and pressure is applied. Because the indium-bismuth diffusion layer has a lower melting temperature, that layer melts before the pure (or relatively pure) indium underneath melts. For example, in one embodiment, the temperature is increased to approximately 100° C., forming a liquid shell or layer around the bump. This liquid shell allows the indium bumps 134 to contact and bond to each other easily under compression. Sufficient pressure is applied to allow the melted alloy of the respective bumps of the components to flow together and to allow the underlying indium bumps 134 to mechanically join. The bonding pressure is also preferably sufficient to allow the bismuth oxide layer outside the bump to rupture if such layers exist. The low melting phase can help push the scattered oxide 140 out of the joint interface, facilitating the indium bump bonding. Assuming that surfaces of bumps on both the device and the substrate are similarly coated, this melting of the diffusion layer occurs at approximately the same temperature for both (around 100° C. in this example). Accordingly, the outside layers of the bumps 134 on the devices 132 can be fused together at a relatively low temperature. If heat is continued to be applied, the diffusion continues.

The thickness of the bismuth or other layer can be controlled so that the desired amount of material remains after diffusion and prior to bonding. For example, the bismuth layer can be selected to be thin enough such that all bismuth is consumed by the diffusion. Where not all the bismuth is consumed, a thin outer crust may be formed as the inner diffusion layer melts. The bonding pressure used in the process is preferably sufficient to crush the outer crust allowing the melted diffusion layers to bond together. Typically, sufficient indium remains beyond the diffusion layer such that solid indium bumps remain, which mechanically interact with each other (device-to-substrate) under the applied pressure. Accordingly, in one embodiment, the bond between the device and the substrate includes remaining indium on the device and substrate, which is mechanically bonded together; a diffusion alloy region, which comprises the diffusion alloy from each side that has melted and fused together; and, in some instances, remaining bismuth that hasn't melted but is held in suspension in the fused alloy region. In some embodiments, when the solid indium bumps contact each other and mechanically bond, the molten diffusion alloy is forced to the periphery of the bond. Accordingly, the diffusion alloy region in the final bond may be located at the periphery of the bonded bumps.

Although the above example describes embodiments using bismuth as the metal coating, other metals are suitable for use as the coating, including alloys. Some such metals and alloys are listed above. In some embodiments, the metals and alloys listed in Table 1 may be used as coatings themselves. In other embodiments, the metals and alloys in Table 1 represent the alloys that are present in the diffusion region after the coating is applied to the bump. For example, a mixture of Ga, Sn, and Zn may be used as an indium bump coating, such that an alloy of In, Ga, Sn, and Zn forms in the diffusion region, in particular, such that Indalloy #46L forms in at least a portion of the diffusion region.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. Additionally, the various embodiments set forth herein are described in terms of exemplary illustrations. As will become apparent to one of ordinary skill in the art after reading this document, the illustrated embodiments and their various alternatives can be implemented without confinement to the illustrated examples.

What is claimed is:

1. An indium solder bump, comprising a diffusion layer at least partially surrounding or incorporated into an arcuate bump bonding surface thereof created by diffusion of a metal passivation layer into the indium solder bump, wherein the arcuate bump bonding surface comprises a top surface of the indium solder bump, and wherein the indium solder bump further comprises a bottom surface, the bottom surface of the indium solder bump contacting a substrate.

2. The indium solder bump of claim 1, wherein the passivation layer comprises at least one of Gallium, Bismuth, Lead, Cadmium and Tin.

3. The indium solder bump of claim 2, wherein the metal passivation layer thickness is between 25 um and 50 um.

4. The indium solder bump of claim 1, wherein the passivation layer comprises first and second layers, each of the first and second layer comprising at least one of Gallium, Bismuth, Lead, Cadmium and Tin.

5. The indium solder bump of claim 1, wherein the passivation layer comprises first and second metal coatings.

6. The indium solder bump of claim 5, wherein the first metal layer comprises gallium and the second metal layer comprises tin.

7. The indium solder bump of claim 5, wherein the first metal layer comprises bismuth and the second metal layer comprises tin, lead or cadmium.

8. The indium solder bump of claim 5, wherein the first metal layer comprises tin and the second metal layer comprises zinc, lead or cadmium.

9. The indium solder bump of claim 5, wherein the passivation layer further comprises a third metal layer.

10. The indium solder bump of claim 9, wherein the first and second layers comprise gallium and tin, and the third layer comprises zinc.

11. The indium solder bump of claim 9, wherein the first and second layers comprise bismuth and lead, and the third layer comprises tin.

12. The indium solder bump of claim 9, wherein the first and second layers comprise tin and lead, and the third layer comprises cadmium.

13. The indium solder bump of claim 1, wherein the top surface contacts another indium solder bump.

14. The indium solder bump of claim 13, wherein the metal passivation layer is Bismuth.

15. The indium solder bump of claim 13, wherein the diffusion layer comprises an Indium-Bismuth low melting phase alloy having a lower melting temperature than the indium solder bump.

16. The indium solder bump of claim 15, wherein the diffusion layer is configured to, upon application of sufficient heat and pressure, flow together with a diffusion layer of the other indium solder bump to allow the indium solder bump and the other indium solder bump to mechanically join.

17. An indium solder bump, comprising a diffusion layer at or near the surface thereof created by diffusion of a metal passivation layer into the indium solder bump, wherein the diffusion layer comprises bismuth present in indium in amounts from approximately 11% to 74%.

18. An indium solder bump, comprising a diffusion layer at or near the surface thereof created by diffusion of a metal passivation layer into the indium solder bump, wherein the diffusion layer comprises bismuth present in indium in amounts from approximately 31% to 39%.

* * * * *